United States Patent [19]

Ionescu

[11] 4,010,417
[45] Mar. 1, 1977

[54] WATT HOUR METER

[76] Inventor: Istrate Ionescu, 35-31 85th St., Jackson Heights, N.Y. 11372

[22] Filed: Jan. 27, 1976

[21] Appl. No.: 652,893

[52] U.S. Cl. .................................................. 324/94
[51] Int. Cl.² ...................................... G01R 27/22
[58] Field of Search ........................... 324/94, 182

[56] References Cited
UNITED STATES PATENTS

| | | | |
|---|---|---|---|
| 3,255,413 | 6/1966 | Marwell et al. | 324/94 |
| 3,290,669 | 12/1966 | Mews | 324/94 X |
| 3,405,274 | 10/1968 | Lakin | 324/94 X |

*Primary Examiner*—Stanley T. Krawczewicz
*Attorney, Agent, or Firm*—Robert D. Farkas

[57] ABSTRACT

This disclosure pertains to an inexpensive watt hour meter apparatus comprising a line cord supplying household energy to an inexpensive energy consuming measuring apparatus employing a coulombmeter in series with a conventional utility outlet socket. A bridge rectifier circuit converts the alternating current to direct current to operate the coulombmeter. One embodiment permits the coulombmeter, having ferrule-like ends, to be reversed mechanically upon completing a measurement so that the interstitial electrolyte solution will, upon a new measurement, move in the opposite direction. Two scales are provided reading in opposite directions to facilitate simple readout of the consumed energy. A second embodiment provides a reversing switch, eliminating the need to physically interchange ends of the coulombmeter. The reversing switch is adapted with a mask which obliterates one scale and leaves exposed the other scale thereby eliminating confusion as to the direction of the moving interstitial electrolyte solution when the coulombmeter is in operation.

7 Claims, 4 Drawing Figures

WATT HOUR METER

BACKGROUND OF THE INVENTION

1. The Field of the Invention

The invention relates to apparatus designed to measure the total amount of electrical energy consumed by a particular electrical load to determine the total energy consumption during the time that the load apparatus is energized.

2. Description of the Prior Art

The prior art abounds with complicated measuring devices including conventional rotating watt hour meters, coulombmeters operated by Hall effect transducers, and the like. Though the available apparatus performs the desired function of measuring the total power consumed by a load, the cost of the apparatus is prohibitive for home use and the complexity of the devices heretofore available preclude simplistic evaluation of the load consuming properties of a particular electrical appliance.

SUMMARY OF THE INVENTION

The invention is an extremely inexpensive portable apparatus designed for home use measurement of consumed electrical energy when a particular electrical device, such as a television set, is connected thereto and operated. A coulombmeter comprised of a glass tube adapted with metallic ferrule ends provides electrical contact to two columns of mercury, separated by an aqueous salt solution. When a direct current is passed through the coulombmeter, electroplating occurs such that the electrolyte solution will move longitudinally along the axis of the glass tube proportionate to the integration of the amount of current flowing over the time period that the current flow exists. Since most electrical loads are operated by alternating current, a bridge type rectifier is provided to convert the alternating current to direct current required to operate the coulombmeter while permitting alternating current to flow through the load apparatus. The bridge circuit by its very nature permits the measuring device to be operable in combination with electrical loads that are operated by direct current.

One embodiment of the instant invention permits the user to easily reverse the coulombmeter when the interstitial salt solution has moved close to one end of the glass indicator. A scale is provided which is calibrated in kilowatt-hours and if desired in dollars and cents, thus eliminating the need for mathematical computations required to calibrate the monetary cost of operating the load apparatus over a period of time.

Another embodiment includes the use of an electrical reversing switch, thereby eliminating the need to physically reverse the coulombmeter when the interstitial electrolyte solution approaches one end of the glass tube. The switch lever is mechanically fastened to a mask which alternatively conceals one of two scales that are reversed reading relative to each other. The switch electrically reverse the coulombmeter in the circuit, providing for the desired direction to be taken by the indicating interstitial plating electrolyte solution while masking the improper reverse reading scale. The user can now observe the indicating solution proceeding in a direction of ever increasing numerals on the exposed scale.

A convenience outlet is provided to electrically connect the measuring device to the plug of the load apparatus. A line cord adapted with a conventional male plug transmits household current to the measuring device. When the load apparatus is de-energized, by either removing its plug from the receptacle or by throwing its internal on-off energizing switch to the off position, no energy is consumed by the measuring device and no further electroplating takes place, thereby keeping the electrolyte solution from further travel, until such time that the load apparatus again demands operating energy.

A primary object of the instant invention is to provide an inexpensive electrical energy consuming indicator.

Another object is to provide an indicator which will not consume energy when the electrical load is de-energized or disconnected from the measuring device.

Still another object is to provide a coulombmeter measuring instrument which can be repeatedly used.

A further object is to provide a measuring instrument with a readout scale calibrated in kilowatt-hours as well as a monetary scale.

Another object is to provide a measuring instrument whose consumption of energy is low when in use.

Still another object is to provide a measuring instrument operable on alternating current as well as direct current sources of energy.

A further object is to provide resetting capabilities of the coulombmeter's indicator at the start of the calibrating scale.

Another object is to provide an apparatus which is free from shock hazard when making internal adjustments to the components when the enclosure is opened.

Still another object is to provide a novel reverse reading operation and readout capability of the coulombmeter, precluding periodic manual electrical reversal of the coulombmeter assembly in its mounting clips.

These objects, as well as other objects of this invention, will become readily apparent after reading the following description of the accompanying drawings.

BRIEF DESCRIPTION OF THE DRAWINGS

FIG. 4 is a perspective view of one end of the ferrule type coulombmeter illustrating the ferrule, interstitial electrolyte solution, and columns of liquid metal.

DESCRIPTION OF THE PREFERRED EMBODIMENT

Figure 1:
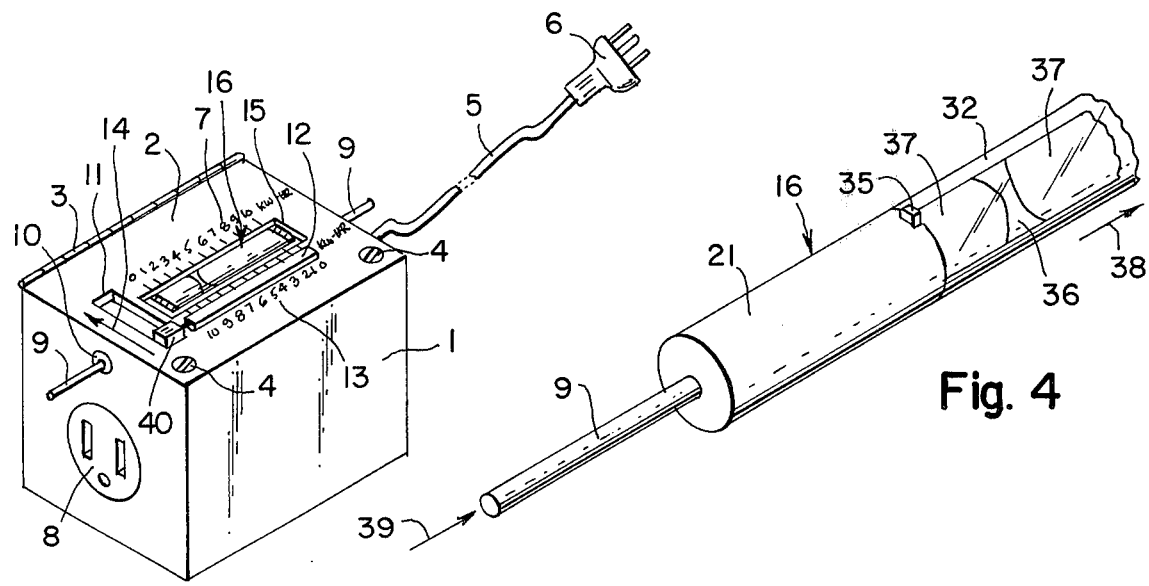
FIG. 1 is a perspective view of the apparatus illustrating a line cord connected to an enclosure adapted with a readout scale, selector switch with mask, and an output receptacle.

The structure and method of fabrication of the present invention is applicable to a device capable of measuring electrical energy consumed by any electrical appliance. An enclosure houses a coulombmeter adapted with metallic conducting ferrule ends fastened to a glass tube. Each ferrule makes contact with a column of mercury within the glass tube. The columns of mercury are separated by an electrolyte salt solution of mercury. When a direct current is passed through the coulombmeter, electroplating takes place consuming liquid metal from one column and transposing the liquid metal to the other column. During this process, the electrolyte moves progressively along the axis of the glass enclosure measuring thereby the time integral of the amplitude of the current flow. Therefore the position of the electrolyte is a measure of total energy consumed by a load apparatus connected to the coulombmeter which derives its source of power from a conventional household utility outlet. A bridge rectifier permits the passage of alternating current from the line cord imput of the measuring device to its output receptacle, while providing a proportional direct current to the coulombmeter proper. The coulombmeter becomes useless in its ability to provide an indication of the energy consumed by the load when the electrolyte solution approaches either end of the glass tube, and it may in fact become destroyed. The preferred embodiment of the instant invention is equipped with snap type connectors, commonly referred to as Fahenstock clips, permitting the physical reversal of the coulombmeter in its electrical circuit. In its new position, the coulombmeter's electrolyte solution will move in the direction of the other distant ferrule. To prevent an accidental shock hazard to the user upon opening the enclosure containing the coulombmeter, an automatic safety disconnect switch or plug and socket assembly is employed, disconnecting the line cord voltage from the circuitry within the enclosure whenever the enclosure's access panel is opened. A scale on the surface of the enclosure provides a readout calibrated in kilowatt-hours and if desired an additional scale calibrated in monetary units. Calibration of the coulombmeter relative to the fixed scale is accomplished by shifting the coulombmeter along its lateral longitudinal axis. Each ferrule is adapted with a radial tab affixed at or near the point at which the ferrule meets the glass tube. This prevents inadvertent shifting of the coulombmeter assembly into a position where the glass body is captured by a mounting clip. The ferrules are of sufficient length to permit shifting of the coulombmeter such that virtually no glass will appear through a slot in the surrounding enclosure in the extreme position. When the electrolyte solution is in some position intermediate the two ferrules and a new measurement cycle is desired, the coulombmeter assembly is shifted so that the electrolyte solution is at the zero mark of the scale. To accomplish this purpose, two rods made from some non-conducting insulating material project through the enclosure and are coaxial with each other and the coulombmeter assembly. Thus the user need not open the enclosure housing the coulombmeter on those occasions and the coulombmeter is to be shifted in its lateral position. Pushing the appropriate rod end towards the side wall of the enclosure shifts both the coulombmeter assembly and the other rod. This process of shifting can continue for successive measurement cycles until such time that the electrolyte solution approximates the ferrule towards which it moves. Mechanical reversal of the coulombmeter assembly, by removal from the coulombmeter mounting clips, accompanied by a minimal amount of lateral shifting, places the coulombmeter's electrolyte solution at the beginning of the scale in preparation for the next measurement.

DESCRIPTION OF AN ALTERNATE EMBODIMENT

To eliminate the necessary manual reversals of the coulombmeter within the mounting clips when the electrolyte has progressed close to one extreme end of the glass tube, a reversing directional switch is employed. The direct current flow through the coulombmeter will be in the opposite direction upon throwing the reversing directional switch. The electrolyte solution now progresses along the aforementioned indicating scale from a higher numbered position towards a lower numbered position. To simplify interpretation and calculations, a second scale is provided at the other longitudinal edge of the slot in the enclosure. This second scale is backwards reading in direction compared to the first scale and may also, if desired, include calibrations in monetary units as well as kilowatt-hours. A rectangular mask whose length equals the length of the slot and whose width is equal to the width of at least the calibration marks, is fastened to the knob or lever of the reversing directional switch. The mask obliterates the view of that scale which would be backwards reading as determined by the new direction taken by the electrolyte solution, newly dependent upon the position of the reversing directional switch. Thus the mask hides the improper scale and exposes the other scale which permits the user to interpret the motion of the electrolyte solution proceeding from a lower number towards a higher number. The elongated metallic ferrules are employed, as aforementioned, in this scheme, to permit successive "zeroing" of the electrolyte for succeeding measurements. When the electrolyte finally reaches a position corresponding to the end of the exposed scale, the reversing switch is thrown. Then minor shifting of the coulombmeter is employed to set the electrolyte solution at the zero position of the newly exposed scale. The measurement device is now ready for further use in either making a new measurement or if desired, a continuation of a proceeding measurement which necessarily had to be temporarily halted when the electrolyte approached the danger zone in being too close to an end of the glass tube.

Now referring to the Figures, and more particularly to the embodiment illustrated in FIG. 1 showing an enclosure 1 whose access panel 2 is provided with a longitudinal hinge 3. Cowl fasteners 4, or the like, secure the access panel in the closed position while permitting the access panel to be disengaged from its locked closed position rapidly and without the use of tools. The line cord 5 is adapted with a conventional two prong plug 6 having a neutral or grounding pin. Scale 7 displays a numerical readout which is in kilowatt-hour units and if desired, an additional scale, not shown, may be provided in monetary units, having its markings parallel to scale 7 positioned intermediate hinge 3 and scale 7. A conventional outlet socket 8 is fastened to a side wall of the enclosure and is capable of accepting the male plugs fastened to the line cords of a variety of electrical loads whose energy consuming property is to be measured. Insulating rods 9 protrude from the enclosure 1 through holes 10 which set as thrust bearings in support of the insulating rods. Slide switch 11 is shown in one extreme position having its associated mask 12 obliterating in part scale 13. When the knob 40 of the slide reversing directional switch 11 is positioned to the other extreme, as shown in the direction of arrow 14, mask 12 proceeds with it and obliterates or shields a part of scale 7. A slot 15 is in the access panel 2 exposes the coulombmeter assembly 16 to view. An insulating transparent material, not shown, is fastened to the inside surface of the access panel 2 intermediate the coulombmeter assembly preventing inadvertant electrical contact to a ferrule and otherwise exposed when visable.

Figure 2:
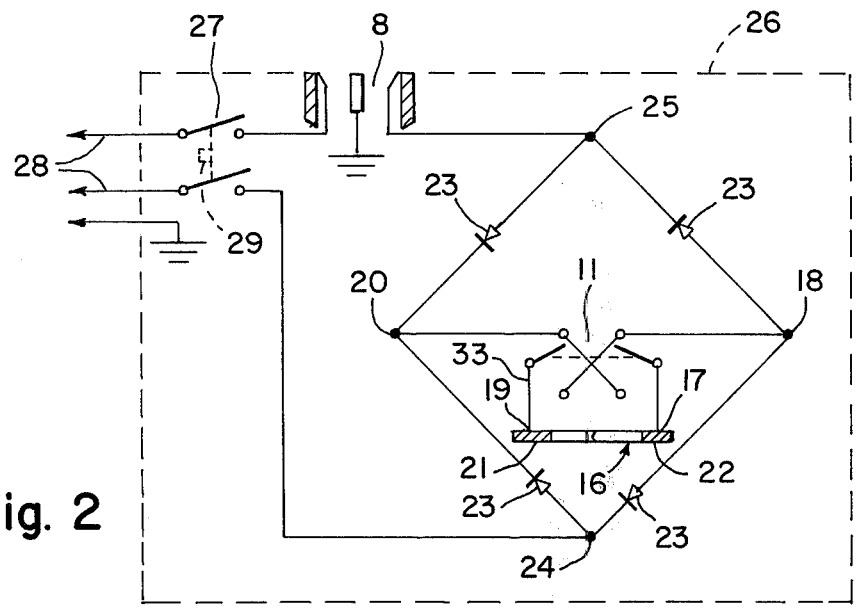
FIG. 2 is an electrical schematic representation of the internal wiring of an embodiment of the device.

FIG. 2 illustrates the electrical circuitry of the embodiment employing the reversing directional switch 11. In the preferred embodiment, switch 11 is not employed and one ferrule end of the coulombmeter is electrically connected from point 17 to point 18 and the other ferrule end is connected from point 19 to point 20, by utilizing two jumpers. The electrical conductors and switch elements depicted by heavier lines are not employed. The coulombmeter 16 is shown adapted with ferrule ends 21 and 23. Rectifiers 23 are wired in a conventional bridge circuit permitting the passage of alternating current from point 24 to point 25 while simultaneously allowing a proportional direct current to flow through the coulombmeter assembly. Throwing the reversing switch permits the direct current component to flow in an opposite direction in the coulombmeter. The rectangle 26 depicted by dotted lines is the equivalent of the boundaries of the enclosure 1 illustrated in FIG. 1. Utility outlet socket 8 is in series with one leg of the input to the bridge rectifier circuit. If no load is connected to the socket, the rectifier circuit is de-energized, avoiding power consumption by the coulombmeter when not in use. A safety disconnect switch 27 interrupts both active lines of the line cord 38 providing a safety measure against shock hazard. The operable lever 29 of switch 27 is adapted to be depressed, thence closing the switch 27, only when the access panel 2, shown in FIG. 1, is fully closed. Switch 27 is a momentary switch insuring automatic disengagement of the electrical circuitry within the boundaries of the enclosure from the line cord 28 which is terminated in the plug 6, as shown in FIG. 1.

Figure 3:
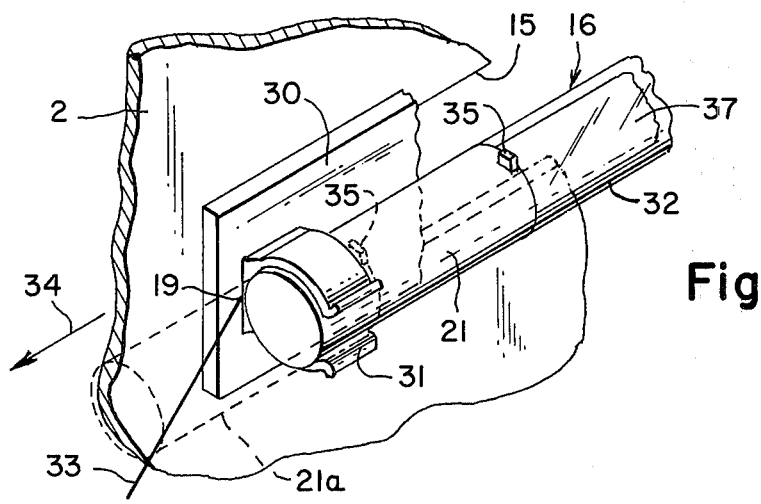
FIG. 3 is a partial perspective view illustrating the mounting provisions for the ferrule type coulombmeter into an electrical snap-like clip and an insulating board fastened to a fragmentary portion of the interior surface of the enclosure.

FIG. 3 is a partial perspective view of the inside surface of the access panel 2 to which is fastened a dual purpose rigid rectangle of transparent plastic 30. Slot 15 is completely covered due to the plastic section extending beyond the length and width of its opening. A snap-in clip 31 is fastened to the plastic strip in such a manner that electrical contact is not made between the snap-in clip and the access panel. The clip is similar in style to the snap type clip used to hold and make contact to the ferrule ends of automotive tubular glass fuses, with the exception that both side edges are identical, neither of them having a small bent tab which precludes the fuse from shifting axially in either direction, laterally along the width of the snap clip. Coulombmeter assembly 16 is shown in part with its glass section 32 and its extended ferrule end 21. Wire 33 fastens to the clip at point 19 and provides an electrical path for the direct current component flowing through the coulombmeter assembly. The dotted projection 21a illustrates the repositioning capabilities of the coulombmeter assembly 16 when shifting in the direction of arrow 34. Tab 35 is fastened at the end of the ferrule 21 adjacent to the end of the glass tube 32 and is utilized to prohibit the unlimited shifting of the coulombmeter 16 along the direction of arrow 34 such that a part of the glass tube is confined or captured by the clip 31.

FIG. 4 illustrates a portion of the coulombmeter assembly 16 in perspective view with its metal ferrule end 21 and a portion of the glass tube 32. The electrolyte solution 36 is confined between the two columns of mercury 37, each having a meniscus at the junction with the electrolyte. Insulating rod 9 is illustrated having one free end in contact with the end of the metallic ferrule 21 and is used to shift the coulombmeter assembly 16 in the direction of arrow 38 when an axial force is applied to the end of the insulating rod in the direction of arrow 39.

One of the advantages is an inexpensive electrical energy consuming indicator.

A further advantage is an indicator which will not consume energy when the electrical load is de-energized or disconnected from the measuring device.

Another advantage is a coulombmeter measuring instrument which can be repeatedly used.

Still another advantage is a measuring instrument with a readout scale calibrated in kilowatt-hours as well as a monetary scale.

A further advantage is a measuring instrument whose consumption of energy is low when in use.

Another advantage is a measuring instrument operable on alternating current as well as direct current sources of energy.

Still another advantage is resetting capabilities of the coulombmeter's indicator at the start of the calibrating scale.

A further advantage is an apparatus which is free from shock hazard when making internal adjustments to the components when the enclosure is opened.

Another advantage is a novel reverse reading operation and readout capability of the coulombmeter, precluding periodic manual electrical reversal of the coulombmeter assembly in its mounting clips.

Thus, there is disclosed in the above description and in the drawings, embodiments of the invention which fully and effectively accomplish the objects thereof. However, it will be apparent, to those skilled in the art, how to make variations and modifications to the instant invention. Therefore, this invention is to be limited not by the specific disclosure herein, but only by the appending claims.

The embodiments of the invention in which an exclusive privilege or property is claimed are defined as follows:

I claim:

1. A watt hour meter comprising a coulombmeter employing two columns of mercury interposed by an electrolyte solution confined within an extended hollow glass tube having substantially elongated coaxial metallic ferrules at each free end of said glass tube, each of said metallic ferrules electrically contacting the non-electrolyte contacting end of each column of mercury, said ferrules are manually detachably contacting two stationary snap-in type mounting contacting clips adapted to permit axial lateral motion of said coulombmeter while said contacting clips grasp a portion of said ferrules, an electrical circuit adapted with a full wave bridge rectifier circuit in series with a utility outlet receptacle and a line cord whose free end is terminated with a utility electrical plug, said bridge rectifier circuit providing a direct current component proportional to an alternating flow through the input terminals of said bridge rectifier circuit when an external electrical lead apparatus is energized during the time period that it is electrically connected to said series utility outlet receptacle accompanied by the simultaneous application of alternating voltage to the terminals of said plug, said bridge rectifier circuit further adapted to provide a proportional direct current component through said coulombmeter when a source of non-periodically reversing voltage is applied to said plug and an electrical load operated by direct current is electrically energized by connection to said utility outlet receptacle, said coulombmeter adapted for convenient manual electrical reversal by interchanging said ferrules in contact with said stationary mounting clips.

2. The watt hour meter of claim 1 in combination with an enclosure housing said bridge rectifier circuit, said coulombmeter, and said utility outlet receptacle, having said line cord protruding therefrom.

3. The watt hour meter of claim 2 further comprising two coaxial insulating rods whose common axis is coincident with the longitudinal axis of said coulombmeter adapted to contact the free ends of said ferrules each slidably mounted to protrude beyond the confines of said enclosure and utilized to laterally position said coulombmeter parallel to the longitudinal edges of a rectangular slot formed in a surface of said enclosure.

4. The watt hour meter of claim 2 further comprising disconnecting means between said line cord and said utility outlet receptacle and said bridge rectifier circuit upon opening an access panel of said enclosure.

5. The watt hour meter of claim 3 further comprising a first scale whose markings on said surface are adjacent and parallel to one longitudinal edge of said slot.

6. The watt hour meter of claim 5 further comprising an electrical switch adapted to reverse the direction of said proportional direct current flow through said coulombmeter when said switch is operated in the reverse direction, the operating lever of said switch fastened to an opaque rectangular mask whose length and width partially conceals said first scale when said operable lever is positioned adjacent one extreme end of the length of said first scale, means to reposition said mask in accordance with a repositioned location of said lever, a second scale having numerical markings in the reverse direction from said first scale located along and parallel to the opposite longitudinal edge of said slot, said mask adapted to conceal said second scale when said lever is in said repositioned location.

7. The watt hour meter of claim 3 further comprising a transparent insulating material intermediate said slot and said coulombmeter totally covering the opening formed by said slot in a surface of said enclosure.

* * * * *